United States Patent [19]
Inoue

[11] Patent Number: 5,976,966
[45] Date of Patent: Nov. 2, 1999

[54] CONVERTING A HYDROGEN SILSESQUIOXANE FILM TO AN OXIDE USING A FIRST HEAT TREATMENT AND A SECOND HEAT TREATMENT WITH THE SECOND HEAT TREATMENT USING RAPID THERMAL PROCESSING

[75] Inventor: Yushi Inoue, Hamamatsu, Japan

[73] Assignee: Yamaha Corporation, Japan

[21] Appl. No.: 08/964,580

[22] Filed: Nov. 5, 1997

[30] Foreign Application Priority Data

Nov. 5, 1996 [JP] Japan ................................. 8-308786

[51] Int. Cl.⁶ ............................................... H01L 21/4763
[52] U.S. Cl. ........................... 438/618; 438/637; 438/670
[58] Field of Search .................................... 438/618, 637, 438/670

[56] References Cited

U.S. PATENT DOCUMENTS

| | | | |
|---|---|---|---|
| 4,756,977 | 7/1988 | Haluska et al. | 428/704 |
| 5,059,448 | 10/1991 | Chandra et al. | 427/53.1 |
| 5,085,893 | 2/1992 | Weiss et al. | 427/387 |
| 5,118,530 | 6/1992 | Hanneman et al. | 427/226 |
| 5,145,723 | 9/1992 | Ballance et al. | 427/397.7 |
| 5,336,532 | 8/1994 | Haluska et al. | 427/515 |
| 5,370,904 | 12/1994 | Mine et al. | 427/126.2 |
| 5,380,567 | 1/1995 | Haluska | 427/578 |
| 5,399,441 | 3/1995 | Bearinger et al. | |
| 5,456,952 | 10/1995 | Garza et al. | |
| 5,458,912 | 10/1995 | Camilletti et al. | 427/126.4 |
| 5,481,135 | 1/1996 | Chandra et al. | |
| 5,506,177 | 4/1996 | Kishimoto et al. | 437/195 |
| 5,693,565 | 12/1997 | Camelletti et al. | |
| 5,750,403 | 5/1998 | Inoue et al. | |
| 5,821,162 | 7/1996 | Yamaha et al. | |
| 5,866,197 | 6/1997 | Bremmer et al. | |
| 5,904,576 | 10/1997 | Yamaha et al. | |
| 5,912,188 | 8/1997 | Gardner et al. | |

FOREIGN PATENT DOCUMENTS

| | | |
|---|---|---|
| 6-181203 | 6/1994 | Japan . |
| 6-181204 | 6/1994 | Japan . |
| 7-37879 | 2/1995 | Japan . |
| 7-283310 | 10/1995 | Japan . |

OTHER PUBLICATIONS

Lee, et al "Application of HSQ (Hydrogen Silsesquioxane) based SOG to pre–metal dielectric planarization in STC (Stacked Capacitor) DRAM," 1996 Symposium on VLSI Technology Digest of Technical Papers, pp. 112–113, 1996.

B.T. Ahlburn, et al., "A Non–Etch Back Spin on Glass for 0.5 μM Devices Using Hydrogen Silsesquioxane As A Replacement for Methylsiloxane", VMIC Conference 1994 ISMIC, Jun. 7–8, 1994, pp. 120–122.

(List continued on next page.)

*Primary Examiner*—Richard Booth
*Assistant Examiner*—Jonathan Hack

[57] ABSTRACT

An insulating film is formed by CVD on the surface of a semiconductor substrate formed with circuit elements such as transistors, and thereafter a hydrogen silsesquioxane resin film is formed on the insulating film by spin-coating or the like. This resin film is sequentially subjected to low temperature annealing at 400° C. or lower and then to high temperature annealing at 700° C. or higher. The low temperature annealing changes the resin film into a silicon oxide film, and the high temperature annealing is performed in order to make dense the film quality of the silicon oxide film. The high temperature annealing is performed by rapid thermal annealing in an oxidizing atmosphere of water vapor or the like. A CVD insulating film is formed on the densified silicon oxide film and planarized by CMP or the like, according to necessity. A contact hole is formed through the CVD insulating film, densified silicon oxide film and the insulating film, and a wiring layer is thereafter deposited.

23 Claims, 4 Drawing Sheets

OTHER PUBLICATIONS

B.T. Ahlburn, et al., "Hydrogen Silsesquioxane–Based Flowable Oxide As An Element in The Interlevel Dielectric for For Sub 0.5 Micron ULSI Circuits", DUMIC Conference 1995 ISMIC, Feb. 21–22, 1995, pp. 36–42.

D.S. Ballance, et al., "Low Temperature Reflow Planarization Using A Novel Spin–On Interlevel Dielectric", VMIC Conference 1992 ISMIC, Jun. 9–10, 1992, pp. 180–186.

D. Pramanik, et al., "Reliability of Multilevel Circuits Using Hydrogen Silsesquioxane FOx For Interlevel Dielectric Planarization", VMIC Conference 1993 ISMIC, Jun 8–9, 1993, pp. 329–331.

Brochure "Application Notes for Dow Corning Flowable Oxide", 1993, Dow Corning Corporation, pp. 1–4.

R. Dawson, et al., "Performace of Logic Devices Utilizing A Novel Spin–On Dielectric Planarization Process", VMIC Conference 1993 ISMIC, Jun. 8–9, 1993, p. 218.

CONVERTING A HYDROGEN SILSESQUIOXANE FILM TO AN OXIDE USING A FIRST HEAT TREATMENT AND A SECOND HEAT TREATMENT WITH THE SECOND HEAT TREATMENT USING RAPID THERMAL PROCESSING

This application is based on Japanese Patent Application No. 8-308786 filed on Nov. 5, 1996, the entire contents of which are incorporated herein by reference.

BACKGROUND OF THE INVENTION a). Field of the Invention

The present invention relates to a manufacture method of a semiconductor device including a wiring layer forming process. More particularly, the invention relates to a manufacture method of a semiconductor device capable of forming an insulating film in short time by using a hydrogen silsesquioxane resin, which film has a good surface flatness and is excellent in resistance to chemicals.

b). Description of the Related Art

As an insulating film having a planarizing function, a spin-on-glass (SOG) film is known. The film quality of this SOG film is inferior, however, to a chemical vapor deposition (CVD) oxide film. A manufacture method of a semiconductor device such as LSIs illustrated in FIGS. 9 and 10 has been conventionally used (for example, refer to JP-A-7-283310).

At the process shown in FIG. 9, a MOS transistor generally indicated at T and having a lightly doped drain (LDD) structure is formed on the surface of a semiconductor substrate by a well-know method. In this transistor T, F indicates a gate insulating film made of silicon oxide or the like, G indicates a gate electrode layer made of polysilicon, polycide, or the like, Ps and Pd indicate side spacers made of silicon oxide or the like, S indicates a source region including an $n^-$ region under the side spacer Ps and an $n^+$ region outside of the side spacer Ps, and D indicates a drain region including an $n^-$ region under the side spacer Pd and an $n^+$ region outside of the side spacer Pd.

Next, an insulating film 2 of silicon oxide is formed over the surface of the substrate 1 by CVD, the insulating film 2 covering the transistor T. On this insulating film 2, an SOG film 3 containing a silanol group is coated by spin-coating or the like to have a flat surface. The SOG film 3 is subjected to low temperature annealing at 150° C. for 30 minutes, at 300° C. for 30 minutes and then at 400° C. for 30 minutes in a nitrogen gas atmosphere. Thereafter, high temperature annealing is performed at 850° C. in an oxidizing atmosphere of water vapor. This high temperature annealing in the oxidizing atmosphere is used for making the quality of the SOG film dense.

Thereafter, a contact hole 4 reaching a partial area of the drain region D is formed through the lamination of the insulating film 2 and SOG film 3 by well-known photolithography and selective etching.

At the process shown in FIG. 10, the inside of the contact hole 4 is washed with diluted hydrofluoric acid in order to remove a natural (or native) silicon oxide film formed on the silicon surface at the bottom of the contact hole 4. Wiring material is then deposited over the substrate surface and patterned to form a wiring pattern 5 which is connected in this state to the partial area of the drain region D via the contact hole 4.

If the high temperature annealing is performed not in an oxidizing atmosphere but in a non-oxidizing atmosphere such as a nitrogen atmosphere, an etching rate during the washing process with diluted hydrofluoric acid may become abnormally fast at some region of the SOG film 3 and may form a void V. If such a void V is formed, a portion of the wiring material may enter the void V so that short circuit between the wiring pattern 5 and another wiring pattern may be formed or the contact state of the wiring pattern 5 may be deteriorated.

However, with the above method, the SOG film 3 is made dense by the high temperature annealing in the oxidizing atmosphere. Therefore, it is possible to prevent the formation of such a void V communicating with the contact hole 4 during the washing process with diluted hydrofluoric acid. Preventing the formation of a void V improves the manufacture yield of a wiring pattern and the reliability of the wiring pattern.

The above conventional method is required to perform high temperature annealing for a long time in the oxidizing atmosphere, in order to prevent the formation of a void V. It has been found that such a long time high temperature annealing deteriorates the electric characteristics of the transistor T.

SUMMARY OF THE INVENTION

It is an object of the present invention to provide a novel wiring pattern forming method capable of forming an underlying layer of the wiring pattern in short time, the underlying layer having a good surface flatness and being excellent in resistance to chemicals.

According to one aspect of the present invention, there is provided a method of forming a wiring layer comprising the steps of: (a) forming an insulating film on one main surface of a semiconductor substrate by vapor deposition, the semiconductor substrate having a region to be electrically connected to a wiring layer; (b) coating a hydrogen silsesquioxane resin film on the insulating film so as to make the hydrogen silsesquioxane resin film have a flat surface; (c) changing the hydrogen silsesquioxane resin film into a silicon oxide film by performing a first heat treatment at a first temperature; (d) making the film quality of the silicon oxide film dense by performing a second heat treatment at a second temperature higher than the first temperature, the second heat treatment using rapid thermal annealing in an oxidizing atmosphere; (e) forming a contact hole through an underlying layer of the wiring layer to reach the region of the semiconductor substrate, the underlying layer including at least the insulating film and the silicon oxide film subjected to the second heat treatment; and (f) forming the wiring layer on the underlying layer, the wiring layer being electrically connected via the contact hole to the region of the semiconductor substrate.

The hydrogen silsesquioxane resin film coated on the insulating film to have a flat surface is changed into the silicon oxide film by the first heat treatment. Thereafter, the quality of the silicon oxide film is made dense by the second heat treatment using rapid thermal annealing which allows the process to be completed in the order of seconds. Accordingly, the underlying film of the wiring layer including the insulating film and silicon oxide film can be formed in short time, which has a good surface flatness and is excellent in resistance to chemicals such as diluted hydrofluoric acid.

As above, the hydrogen silsesquioxane resin film coated to have a flat surface is changed into the silicon oxide film, and thereafter the film quality of the silicon oxide film is made dense by performing the heat treatment using rapid thermal annealing in an oxidizing atmosphere. It is therefore possible to form an underlying layer of the wiring layer, having a good surface flatness and being excellent in resistance to chemicals. Since a void is not formed during the process of washing the inside of the contact hole, the manufacture yield and reliability of wiring layers can be improved.

If an insulating film is formed by vapor deposition on the silicon oxide film whose film quality was made dense and this insulating film is planarized, the flatness of the underlying layer of the wiring layer is improved further and the manufacture yield of wiring layers is improved further.

DETAILED DESCRIPTION OF THE PREFERRED EMBODIMENTS

FIGS. 1 to 8 illustrate wiring forming processes of a semiconductor device manufacture method according to an embodiment of the invention. Wiring forming processes (1) to (8) corresponding to FIGS. 1 to 8, respectively, will be described sequentially in this order.

Figure 1:
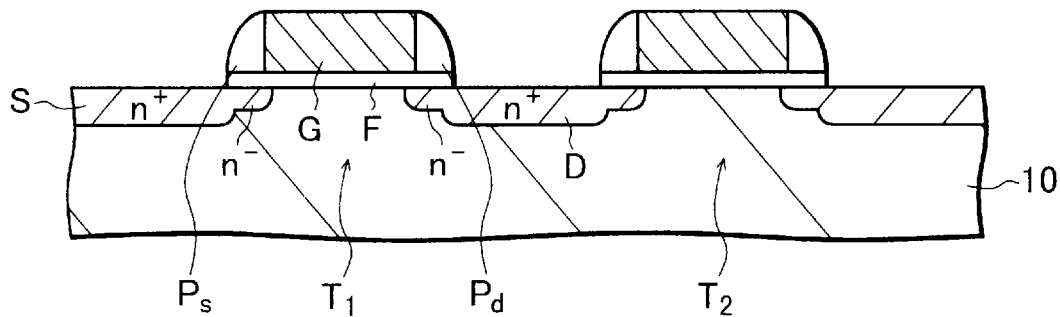
FIG. 1 is a cross sectional view of a substrate illustrating a transistor forming process of a method of manufacturing a semiconductor device according to an embodiment of the invention.
Figure 2:
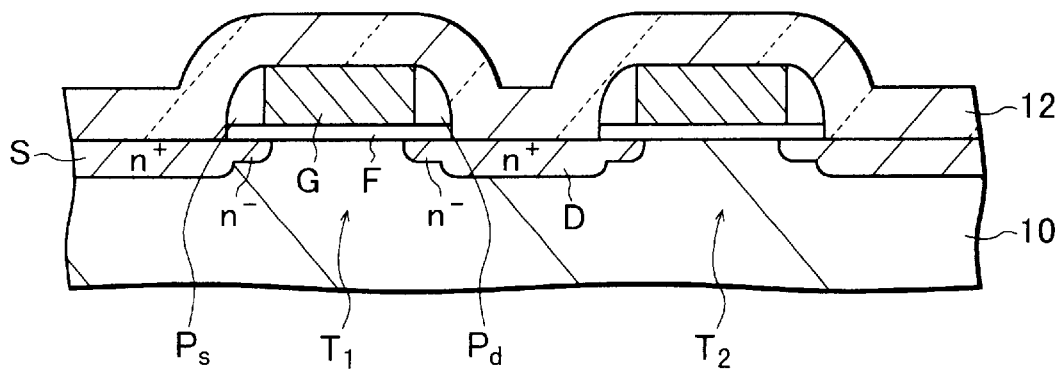
FIG. 2 is a cross sectional view of the substrate illustrating an insulating film forming process after the process shown in FIG. 1.
Figure 3:
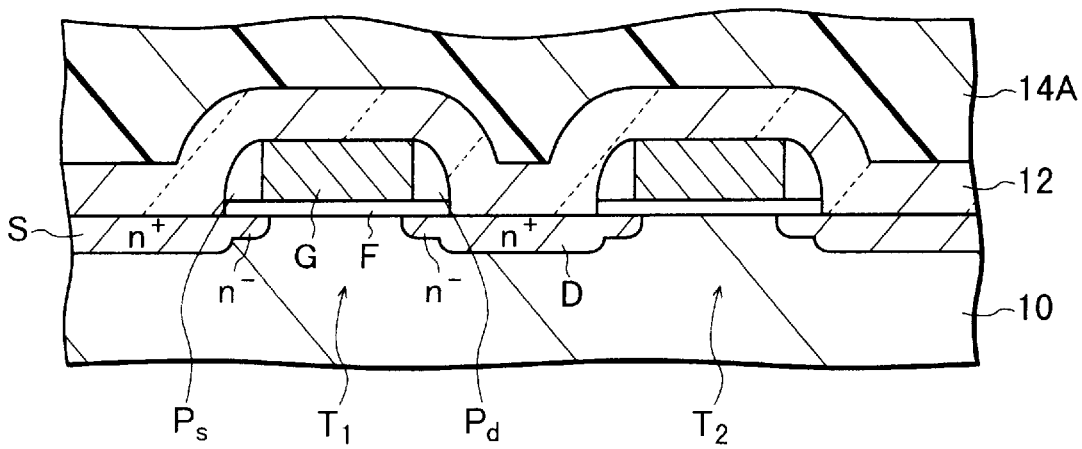
FIG. 3 is a cross sectional view of the substrate illustrating a resin film forming process after the process shown in FIG. 2.
Figure 4:
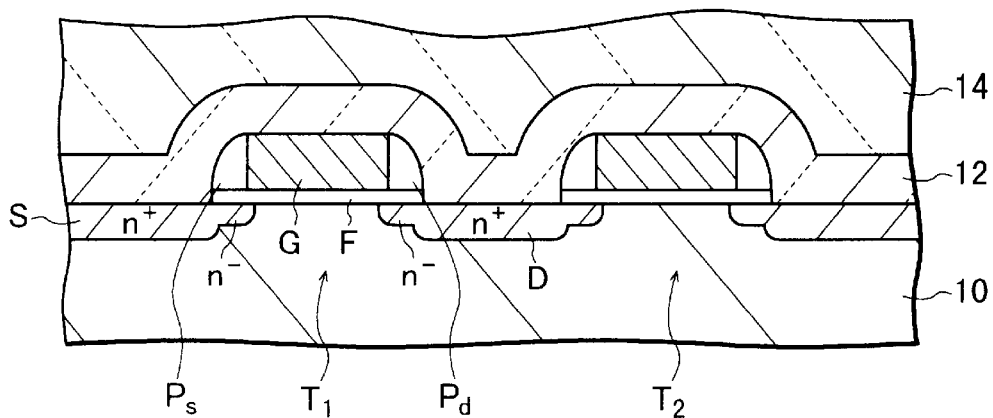
FIG. 4 is a cross sectional view of the substrate illustrating a silicon oxide film forming process after the process shown in FIG. 3.
Figure 5:
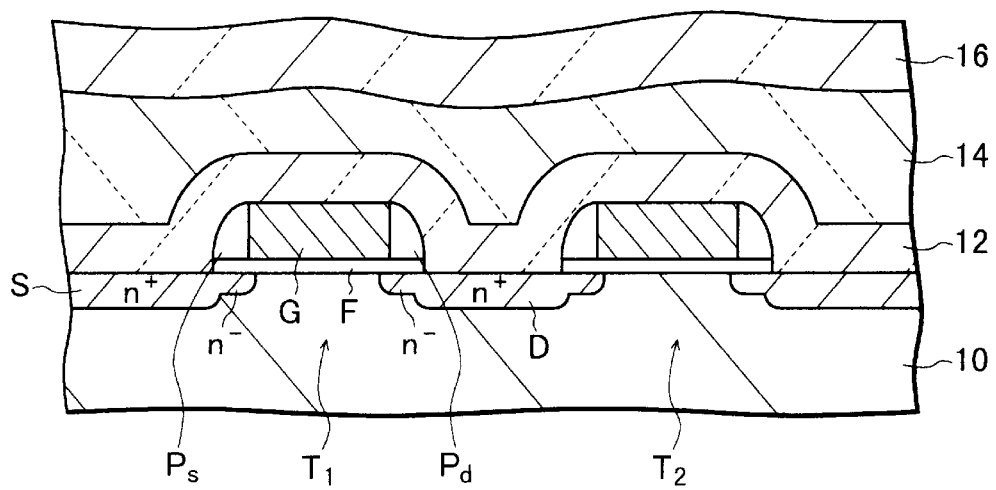
FIG. 5 is a cross sectional view of the substrate illustrating an insulating film forming process after the process shown in FIG. 4.
Figure 6:
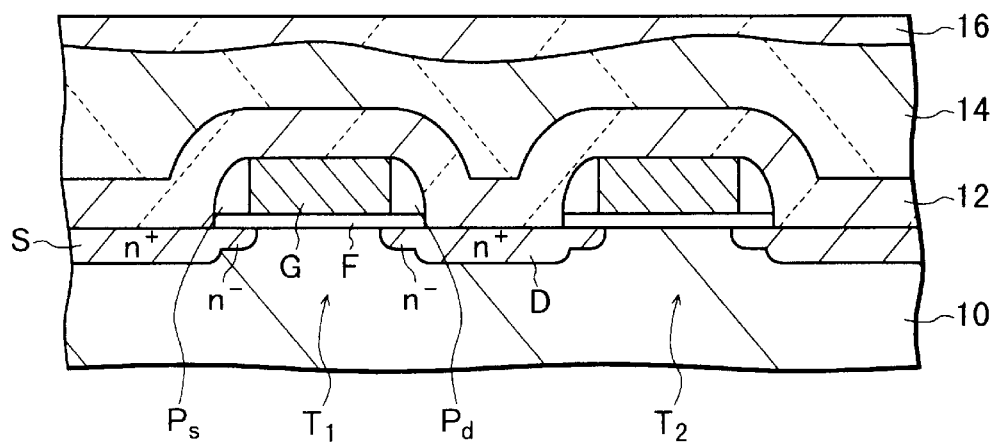
FIG. 6 is a cross sectional view of the substrate illustrating a CMP process after the process shown in FIG. 5.
Figure 7:
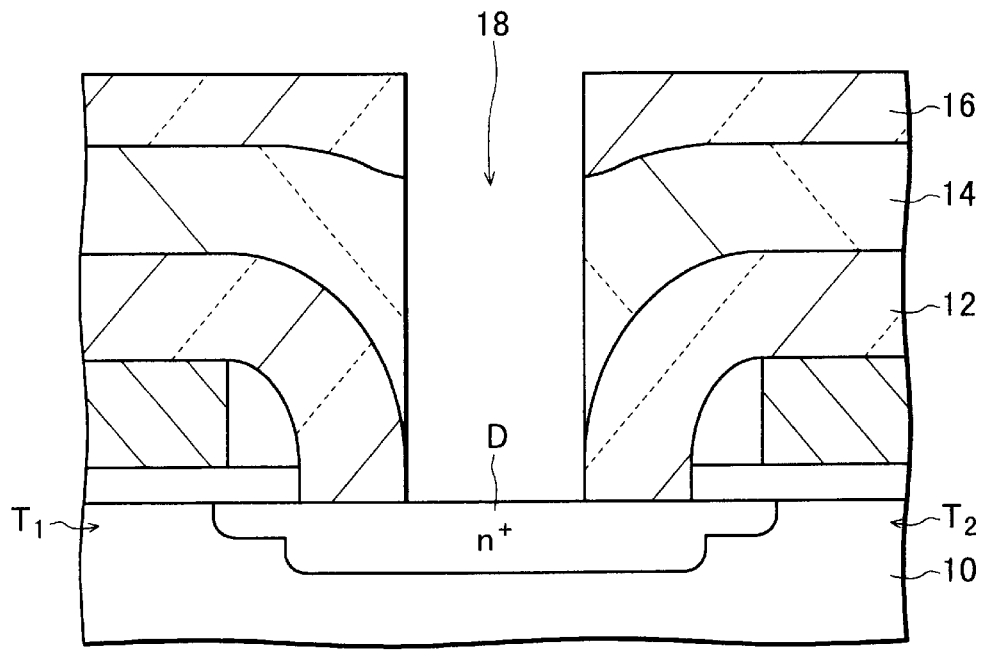
FIG. 7 is a cross sectional view of the substrate illustrating a contact hole forming process after the process shown in FIG. 6.
Figure 8:
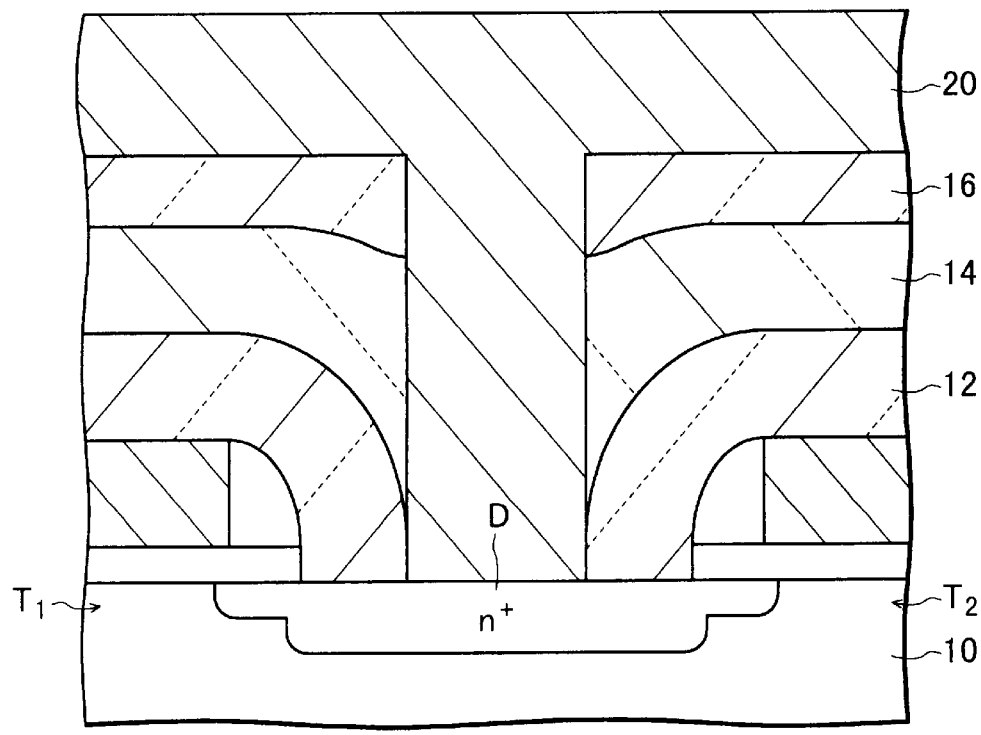
FIG. 8 is a cross sectional view of the substrate illustrating a wiring layer forming process after the process shown in FIG. 7.
Figure 9:
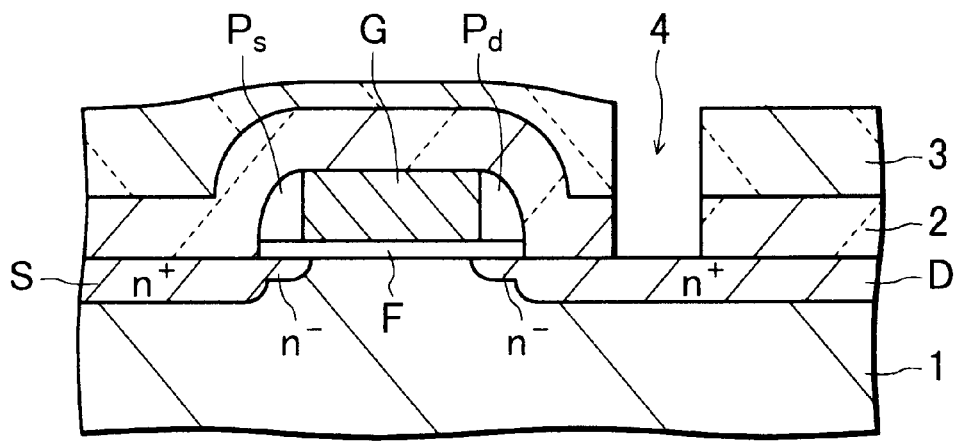
FIG. 9 is a cross sectional view of a substrate illustrating a contact hole forming process of a conventional method of manufacturing a semiconductor device.

(1) On the surface of a semiconductor substrate 10 made of, for example, p-type silicon, MOS transistors $T_1$ and $T_2$ of the n-channel type are formed. Each transistor has source/drain regions of the LDD structure similar to the structure described with FIG. 9. Like elements to those shown in FIG. 9 are represented in FIG. 1 by identical reference symbols, and the detailed description thereof is omitted here.

(2) An insulating film 12 formed of silicon oxide is deposited on the surface of the substrate 10 by CVD, the insulating film covering the transistors $T_1$ and $T_2$. In order to make the quality of the insulating film 12 dense, the insulating film 12 is subjected to high temperature annealing at 700° C. or higher.

(3) Solution of hydrogen silsesquioxane resin $(HSiO_{3/2})n$ dissolved in MIBK (methylisobutylketone) is spin-coated on the insulating film 12 to form a hydrogen silsesquioxane resin film 14A having a flat surface. The conditions of spin coating are, for example, 5000 rpm and 30 seconds.

(4) The resin film 14A is subjected to low temperature annealing at 400° C. or lower to change the resin film 14A to a ceramic silicon oxide film 14. The low temperature annealing is performed in order to remove solvent from the resin film 14A and change this film 14A into silicon oxide, and is preferably performed for 30 minutes or longer. The low temperature annealing is performed, for example, by hot plate baking at 150° C. for 60 seconds + at 200° C. for 60 seconds+at 300° C. for 60 seconds in an atmosphere of inert gas such as $N_2$, followed by annealing at 400° C. for 60 minutes in an inert gas atmosphere in a resistance heating vertical furnace.

Next, the silicon oxide film 14 is subjected to high temperature annealing at 700° C. or higher to change the quality of the film 14 to a dense silicon film. The high temperature annealing is performed for removing water contents from the ceramic silicon oxide film 14 and causing glass transition of the film 14. This annealing is performed, for example, by raising the temperature by lamp heating to 850° in 10 seconds in an oxidizing atmosphere (e.g., water vapor), followed by thermal annealing (e.g., lamp annealing) for maintaining the state of 850° C. for 10 seconds. The rapid thermal annealing is a process completed in one minute or shorter, or preferably in 30 seconds or shorter.

This rapid thermal annealing for making the quality of the silicon oxide film 14 dense can be completed in short time. Therefore, impurities in the semiconductor can be prevented from being re-distributed, and a shallow junction depth and a desired threshold value can be maintained unchanged. It is therefore possible to prevent the deterioration of circuit elements such as transistors $T_1$ and $T_2$.

(5) An insulating film 16 of boronphosphosilicate glass (BPSG) or phosphositicate glass (PSG) is deposited to a thickness of 100 to 1000 nm by CVD, the insulating film 16 covering the silicon oxide film 14 made dense. The conditions of forming the insulating film 16 of BPSG by normal pressure (1 atm) CVD are illustratively given in the following.

Substrate temperature: 400° C.
Source gas: $SiH_4$ (46.25 sccm)+$PH_3$ (8.75 sccm)+$B_2H_6$ (7.5 sccm)+$O_2$ (7000 sccm)+$N_2$ (50000 sccm)

The conditions of forming the insulating film 16 of PSG by normal pressure (1 atm) CVD are illustratively given in the following.

Substrate temperature: 400° C.
Source gas: $SiH_4$ (240 sccm)+$PH_3$ (70 sccm)+$N_2O$ (5000 sccm)+$N_2$ (2730 sccm)

(6) The surface of the insulating film 16 is polished by chemical mechanical polishing (CMP) to leave an insulating film 16 having a flat surface.

(7) A contact hole is formed by photolithography and selective etching through a lamination of the insulating film 12, silicon oxide film 14 and planarized insulating film 16, to reach a partial area of the drain region D.

Figure 10:
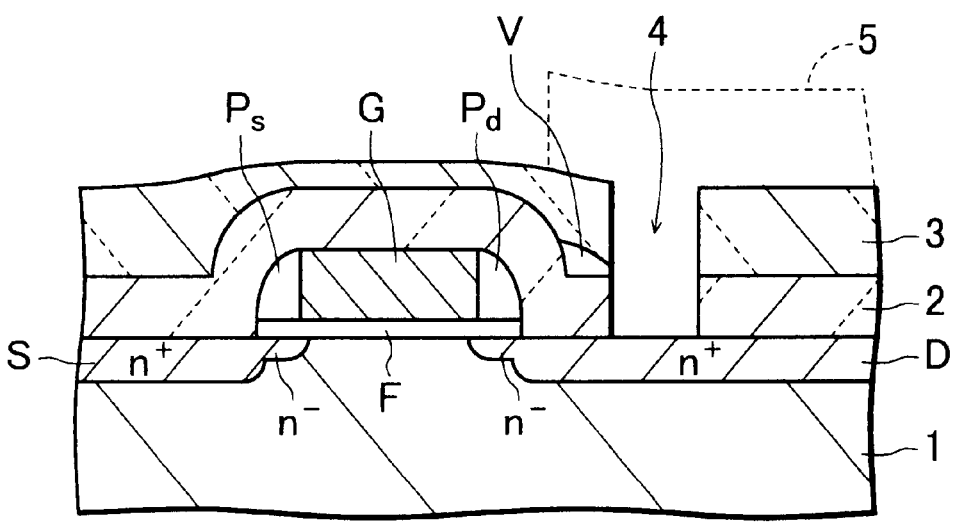
FIG. 10 is a cross sectional view of the substrate illustrating a contact hole washing process after the process shown in FIG. 9.

(8) The inside of the contact hole 18 is washed with diluted hydrofluoric acid to remove a natural silicon oxide film formed on the silicon surface at the bottom of the contact hole 18. In this case, since the silicon oxide film 14 was subjected to the process of FIG. 4 for making the film quality dense, a void (such as indicated at V in FIG. 10) is not formed during the washing process with diluted hydrofluoric acid.

After the washing process with diluted hydrofluoric acid, a wiring layer is deposited on the substrate surface and patterned by photolithography and selective dry etching to form a wiring pattern 20. The wiring pattern 20 is connected in this state to the drain region D via the contact hole 18.

In this embodiment, a void communicating with a contact hole is not formed during the process of washing the inside of the contact hole 18 with diluted hydrofluoric acid. Therefore, the manufacture yield and reliability of wiring layers can be improved.

Furthermore, since the wiring layer 20 is formed after the insulating film 16 is planarized, the manufacture yield of wiring layers can be improved.

The present invention is not limited only to the above-described embodiment, but various modifications are possible. For example:

(1) A process of planarizing the insulating film 16 may be an etch-back process instead of a CMP process.

(2) The insulating film 16 may not be subjected to a planarizing process or it may not be formed.

(3) Circuit components are not limited to MOS transistors $T_1$ and $T_2$, but other components such as bipolar transistors may be used.

The present invention has been described in connection with the preferred embodiment. The invention is not limited only to the above embodiment. It is apparent that various modifications, improvements, combinations, and the like can be made by those skilled in the art.

What is claimed is:

1. A method of forming a wiring layer comprising the steps of:
   (a) forming an insulating film on one main surface of a semiconductor substrate by vapor deposition, the semiconductor substrate having a region to be electrically connected to a wiring layer;
   (b) coating a hydrogen silsesquioxane resin film on the insulating film so as to make the hydrogen silsesquioxane resin film have a flat surface;
   (c) changing the hydrogen silsesquioxane resin film into a silicon oxide film by performing a first heat treatment at a first temperature;
   (d) making the film quality of the silicon oxide film dense by performing a second heat treatment at a second temperature higher than the first temperature, the second heat treatment using rapid thermal annealing in an oxidizing atmosphere;
   (e) forming a contact hole through an underlying layer of the wiring layer to reach the region of the semiconductor substrate, the underlying layer including at least the insulating film and the silicon oxide film subjected to the second heat treatment; and
   (f) forming the wiring layer on the underlying layer, the wiring layer being electrically connected via the contact hole to the region of the semiconductor substrate.

2. A method according to claim 1, further comprising the steps of:
   (g) forming a second insulating film by vapor deposition on the silicon oxide film subjected to the second heat treatment; and
   (h) removing the surface of the second insulating film to leave a second insulating film having a flat surface, wherein said step (e) is a step of forming the contact hole through the underlying layer including at least the first insulating film, the silicon oxide film subjected to the second heat treatment, and the second insulating film with the flat surface, to reach the region of the semiconductor substrate.

3. A method according to claim 1, wherein the first temperature in said step (c) is 400° C. or lower.

4. A method according to claim 1, wherein the second temperature in said step (d) is 700° C. or higher.

5. A method according to claim 1, wherein said step (d) is completed in one minute or shorter.

6. A method according to claim 1, wherein said step (d) is completed in 30 seconds or shorter.

7. A method according to claim 1, wherein said step (d) is performed by lamp heating.

8. A method according to claim 1, wherein said step (c) is performed in a resistance heating furnace.

9. A method according to claim 8, wherein said step (c) is performed for 30 minutes or longer.

10. A method according to claim 2, wherein said step (h) includes an etch-back process.

11. A method according to claim 2, wherein said step (h) includes a chemical mechanical polishing process.

12. A method of fabricating a wiring comprising the steps of:
   (a) providing a substrate having conductive regions and an overlying structure thereon;
   (b) forming a hydrogen silsesquioxane resin film over the substrate;
   (c) subjecting said hydrogen silsesquioxane resin film to a first heat treatment in an inert gas atmosphere to convert said hydrogen silsesquioxane resin film into a silicon oxide film;
   (d) subjecting said silicon oxide film to a second heat treatment by a rapid thermal annealing in an oxidizing gas atmosphere to densify the silicon oxide film;
   (e) forming a connecting hole through the silicon oxide film; and
   (f) forming a wiring layer in the connecting hole so as to make an electrical contact between the wiring layer and the conductive region.

13. A method according to claim 12, wherein the first heat treatment is performed at a temperature of 400° C. or lower.

14. A method according to claim 12, wherein the second heat treatment is performed at a temperature of 700° C. or higher.

15. A method according to claim 12, wherein the inert gas atmosphere is a nitrogen gas atmosphere.

16. A method according to claim 12 further comprising the steps of;
   (a-1) after the step (a), forming a first interlayer insulating film over the substrate and the overlying structure; and
   (d-1) after the step (d), forming a second interlayer insulating film over the densified silicon oxide film.

17. A method according to claim 16, where the connecting hole is provided through the first interlayer insulating film, the second interlayer insulating film and the densified silicon oxide film.

18. A method according to claim 16, wherein the second interlayer insulating film is made by using one of a method of forming a phosphosilicate glass film or a borophosphosilicate glass film by atmospheric pressure chemical vapor deposition (CVD).

19. A method of fabricating a wiring comprising the steps of:
   (a) providing a substrate having a gate electrode, source and drain regions thereon;
   (b) forming a first interlayer insulating film;

(c) forming a hydrogen silsesquioxane resin film over first interlayer insulating film and the first level wiring;

(d) subjecting said hydrogen silsesquioxane resin film to a first heat treatment in an inert gas atmosphere to convert said hydrogen silsesquioxane resin film into a second interlayer insulating film;

(e) subjecting said second interlayer insulating film to a second heat treatment by a rapid thermal annealing in an oxidizing gas atmosphere to densify the silicon oxide film; and (f) forming a third interlayer insulating film and a second level wiring over the silicon oxide film of the preceramic phase.

20. A method according to claim 19, wherein the first heat treatment is performed at a temperature of 400° C. or lower.

21. A method according to claim 19, wherein the second heat treatment is performed at a temperature of 700° C. or higher.

22. A method according to claim 19, wherein the inert gas atmosphere of the heat treatment is nitrogen gas.

23. A method according to claim 19, wherein the third interlayer insulating film is made by using one of a method of forming a phosphosilicate glass film or a borophosphosilicate glass film by atmospheric pressure chemical vapor deposition (CVD).

* * * * *